United States Patent
Irani et al.

[11] Patent Number: 5,838,046
[45] Date of Patent: Nov. 17, 1998

[54] OPERATING METHOD FOR ROM ARRAY WHICH MINIMIZES BAND-TO-BAND TUNNELING

[75] Inventors: Rustom F. Irani, Santa Clara, Calif.; Boaz Eitan, Ra'anana, Israel; Mark Michael Nelson; Larry Willis Petersen, both of Pocatello, Id.

[73] Assignees: Waferscale Integration Inc., Fremont, Calif.; American Microsystems, Inc., Pocatello, Id.

[21] Appl. No.: 665,136

[22] Filed: Jun. 13, 1996

[51] Int. Cl.⁶ ..................................... H01L 29/76
[52] U.S. Cl. ............................. 257/369; 257/390
[58] Field of Search .................... 257/369, 390, 257/391; 365/104

[56] References Cited

U.S. PATENT DOCUMENTS 4,592,020   5/1986   Takemae et al. .................. 365/189
4,888,735  12/1989   Lee et al. ........................ 365/185

Primary Examiner—Sara W. Crane
Attorney, Agent, or Firm—Skjerven, Morrill, MacPherson, Franklin & Friel LLP

[57] ABSTRACT

A read only memory (ROM) array is disclosed which includes a) a voltage supply providing an operating voltage level, b) a plurality of word-lines, c) a multiplicity of ROM transistors, and d) a word-line clamper. The ROM transistors are divided into turned on and turned off transistors. Each ROM transistor has a gate connected to one of the word-lines, a gate oxide beneath the gate, whose thickness is less than 250 Å, and a channel beneath the gate oxide. The turned off transistors additionally have a ROM implant in their channel whose dosage is no larger than the amount which generates a predetermined desired minimal band-to-band tunneling current The ROM implant and gate oxide thickness define a threshold voltage for the tamed off tranistors, the threshold voltage being less than the operating voltage level. The word-line damper provides a word-line voltage to each of the word-lines, the word-line voltage being clamped to a voltage level no higher than the threshold voltage of the turned off transistor.

2 Claims, 5 Drawing Sheets

5,838,046

OPERATING METHOD FOR ROM ARRAY WHICH MINIMIZES BAND-TO-BAND TUNNELING

FIELD OF THE INVENTION

The present invention relates to read only memory (ROM) arrays generally and to methods of operating them without incurring significant band-to-band leakage in particular.

BACKGROUND OF THE INVENTION

Read only memory (ROM) array chips are very well known in the art. The chips are formed of a ROM array core, comprising a multiplicity of ROM cells, and a periphery formed of control elements controlling the operation of the array core.

The ROM array stores programs and/or data in the form of bits, where a bit is either on (a logical value of 1) or off (a logical value of 0). Each bit is stored in a single cell, which is a single gate, n-channel transistor or ROM cell. A logical 0 is implemented with a transistor which has been shut off, such that it will not conduct when voltage is applied to it and a logical 1 is implemented with an active transistor which conducts when voltage is applied to it.

FIG. 1, to which reference is now made, illustrates a slice through a prior art ROM array chip showing one transistor 8 of the periphery, labeled 32, and two transistors 10 and 12 of the ROM array core, labeled 30, formed on a substrate 14. Transistor 8 and the other components of the periphery are formed separately from the transistors 10 and 12 of the ROM array. Periphery transistor 8 is formed of source and drain implants 4 and 5 and a polysilicon gate 20 and is surrounded by field oxide elements 6, which isolate transistor 8 from neighboring components. The gate 20 is formed above a gate oxide layer 2. The size, shape and thickness of the elements of the periphery transistor 8 may be determined, for example, by complementary metal oxide semiconductor (CMOS) periphery circuit requirements. For example, for a 0.8 μm CMOS technology, the gate oxide 2 is 150 Å, the dose for the $N^+$ implant 5 is $4\times10^{15}$ atoms/cm$^2$ and the thickness of the field oxide 6 is 6000 Å.

The transistors 10 and 12 are closer to each other than are neighboring components of the periphery. In fact, in the virtual ground ROM array of FIG. 1, the transistors 10 and 12 share diffusion bit lines 16 which act as the drain for one transistor and the source for the neighboring transistor. Between the bit lines 16 are channels 22. Other ROM architectures have the same problems as those described hereinbelow.

On top of the substrate 14 is a layer of oxide 18 on top of which is a row of polysilicon, also labeled 20. The layer of oxide is divided into columns (in the direction of the paper) of bit line oxides 18A, located on top of the bit lines 16, and gate oxides 18B, located on top of the channels 22 formed between the bit lines 16. The bit line oxides 18A are typically thicker than the gate oxides 18B. It is noted that the field oxide elements 6 are much thicker than the bit line oxides 18A. For example, in 0.8 μm technology, the bit line oxides 18A are typically 1000 Å and the field oxides 6 are typically 6000 Å.

Transistor 12 additionally has a dopant 24 implanted into its channel 22. This dopant, which is typically formed of Boron, raises the threshold voltage level Vth of the transistor 12 to above the standard activation voltage level such that, when the standard activation voltage is applied thereto, transistor 12 will not turn on. Transistor 12 thus stores a logical 0. This is not true of transistor 10 which has no extra dopant in its channel 22 and therefore, has a low Cold voltage of about 0.8 V. Thus, transistor 10, which stores a logical 1, will turn on when the standard activation voltage is applied thereto.

Typically, the dopant 24 is implanted into the channel 22 of transistor 12 during a ROM implant process. This process may occur, for example, after the polysilicon layer 20 has been laid down. The desired concentration of dopant 24 is a function of the thickness of the gate oxide layer 18B, wherein the current trend is to reduce the thickness. The thinner the gate oxide layer 18B is, the higher the concentration of dopant 24 which is needed to bring the threshold voltage level Vth to close to the same voltage level. For example, if the desired voltage level is 5 V, then a dose of $6\times10^{13}$ atoms/cm$^2$ of dopant is needed to produce a reasonable concentration (defined in atoms/cm$^3$) of dopant 24 for a gate oxide 18B of 150 Å. Similarly, a dose of $3.5\times10^{13}$ atoms/cm$^2$ is needed for a gate oxide 18B of 250 Å.

However, when the dopant 24 is present in large quantities such that the concentration in the channel is a few times $10^{18}$ atoms/cm$^3$, it causes "band-to-band" tunneling of current $I_{BB}$ from the bit line 16 to the substrate 14 of the transistor 12. If this leakage current is large enough (for example, at a level of 30 μA per bit line or 30 nA per cell in a 1 Mbit array with 1000 transistors on a bit line or half of that for a 4 Mbit array), it will cause all "0"s on this bit line to look as though they were conducting "1"s. Furthermore, in virtual ground arrays such as is shown in FIG. 1, this band-to-band tunneling current can cause a high standby current $I_{BB}$. For example, for a 4 Mbit array, to maintain a standby current $I_{BB}$ of less than 1 μA, the maximum band-to-band tunneling current $I_{BB}$ per cell has to be less than 0.25 pA.

These two examples demonstrate a major problem in scaling (i.e. reducing the size of) ROM cells. As the ROM cells get smaller, the channels 22 become less wide and, in order to provide the same threshold voltage $V_T$, the gate oxide must be thinner. The thinner gate oxide forces a higher dosage for the "0" implant 24. The lager dosage, though, has more band-to-band tunneling current $I_{BB}$ per cell. In addition, the typically smaller scale ROM cells are utilized to create larger arrays and thus, the amount of band-to-band leakage in the entire array becomes unacceptable large vis-a-vis the desired standby current $I_{BB}$. Thus, due to the band-to-band tunneling current $I_{BB}$, the scaling requirements and standby current $I_{BB}$ requirements work against each other.

Reference is now made to FIGS. 2, 3 and 4 which illustrate the physics of the the band-to-band tunneling current $I_{BB}$ and its dependence on various parameters of the array.

FIG. 2 illustrates the band-to-band tunneling current $I_{BB}$ versus the implant dose into the channel 22, for a fixed bit line voltage $V_{BL}$ of 1.6 V and a fixed temperature T of 25° C. FIG. 2 indicates that the lower the channel implant dose, the lower the band-to-band tunneling current $I_{BB}$.

FIG. 3 illustrates the band-to-band tunneling current $I_{BB}$ versus the implant dose into the bit lines 16, for a fixed bit line voltage $V_{BL}$ of 1.6 V and a fixed temperature T of 25° C. FIG. 3 indicates that the bit line implant also affects the band-to-band tunneling current $I_{BB}$ where, the lower the bit line implant dose, the lower the band-to-band tunneling current $I_{BB}$.

FIG. 4 illustrates the band-to-band tunneling current $I_{BB}$ versus the voltage $V_{BL}$ placed on the bit line. FIG. 4 has four curves, 26, 27, 28 and 29, one for each of four channel implant doses, $5.5\times10^{13}$, $9.0\times10^{13}$, $12.5\times10^{13}$ and $16.0\times10^{13}$, respectively. The curves 26–29 indicate that, for any given dosage level, as the bit line voltage $V_{BL}$ increases, the band-to-band tunneling current $I_{BB}$ increases, Specifically, the current $I_{BB}$ increases by more than an order of magnitude in response to an increase of 1 V in the bit line voltage. Furthermore, at a given voltage level, an increase in the implant level causes an increase of a few orders of magnitude, in the current $I_{BB}$.

FIGS. 2, 3 and 4 indicate that the band-to-band tunneling current $I_{BB}$ is a fiction of the bit line voltage $V_{BL}$, the implant dosage level in the channel and the bit line implant dosage level. As mentioned hereinabove, the implant dosage level has only recently become large due to the reduction in thickness of the gate oxide. Until the gate oxide became quite thin, the implant dosage was low enough that the band-to-band tunneling current $I_{BB}$ was low or non-existent. With the sealed down and larger ROM arrays of today, the band-to-band tunneling current $I_{BB}$ is significant.

SUMMARY OF THE PRESENT INVENTION

It is therefore an object of the present invention to provide a ROM array with minimal band-to-band tunneling current.

Applicants have realized that one can define the channel (or ROM implant dosage by the desired maximal band-to-band tunneling current. Unfortunately, if the gate oxides of the array are thin (at or below 150 Å), such a low ROM implant dosage produces a turned off transistor with a lower than desired threshold voltage. Applicants have further realized that the low threshold turned off transistors will perform correctly as long as the control voltage at their gates is below their threshold voltage.

In accordance with a preferred embodiment of the present invention, the ROM array includes a word-line clamper which clamps the word line voltages to just below the maximal threshold level of the turned off transistors, thereby ensuring that there is the maximal acceptable band-to-band tunneling current flowing in a turned off transistor when it is accessed.

Specifically there is provided, in accordance with a preferred embodiment of the present invention, a ROM array including a) a voltage supply providing an operating voltage level, b) a plurality of word-lines, c) a multiplicity of ROM transistors and d) a word-line clamper. The ROM transistors are divided into tune on and turned off transistors. Each ROM transistor has a gate connected to one of the word-lines, a gate oxide whose thickness is less than 250 Å, and a channel beneath the gate oxide. The turned off transistors additionally have a ROM implant in their channel whose dosage is no larger than the amount which generates a predetermined desired minimal band-to-band tunneling current. The ROM implant and gate oxide thickness define a threshold voltage for the turned off transistors, the threshold voltage being less than the operating voltage level. The word-line clamper provides a word-line voltage to each of the word-lines, the word-line voltage being clamped to a voltage level no higher than threshold voltage of the turned off transistor.

Additionally, in accordance with a preferred embodiment of the present invention, the gate oxide thickness is dictated by the requirements of the periphery circuitry.

BRIEF DESCRIPTION OF THE DRAWINGS

The present invention will be understood and appreciated more fly from the following detailed description taken in conjunction with the drawings in which.

DETAILED DESCRIPTION OF A PREFERRED EMBODIMENT

Figure 1:
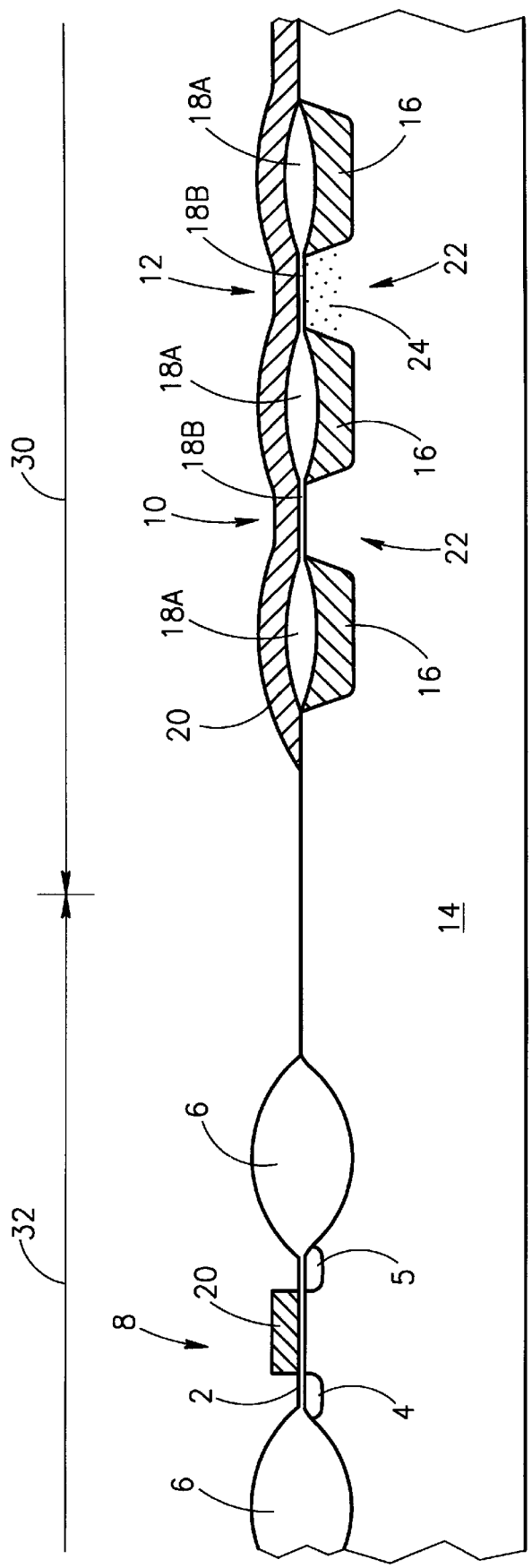
FIG. 1 is a cross-sectional view of a slice of the ROM chip including two prior art ROM transistors, one which is on and one which is off and a periphery transistor.
Figure 2:
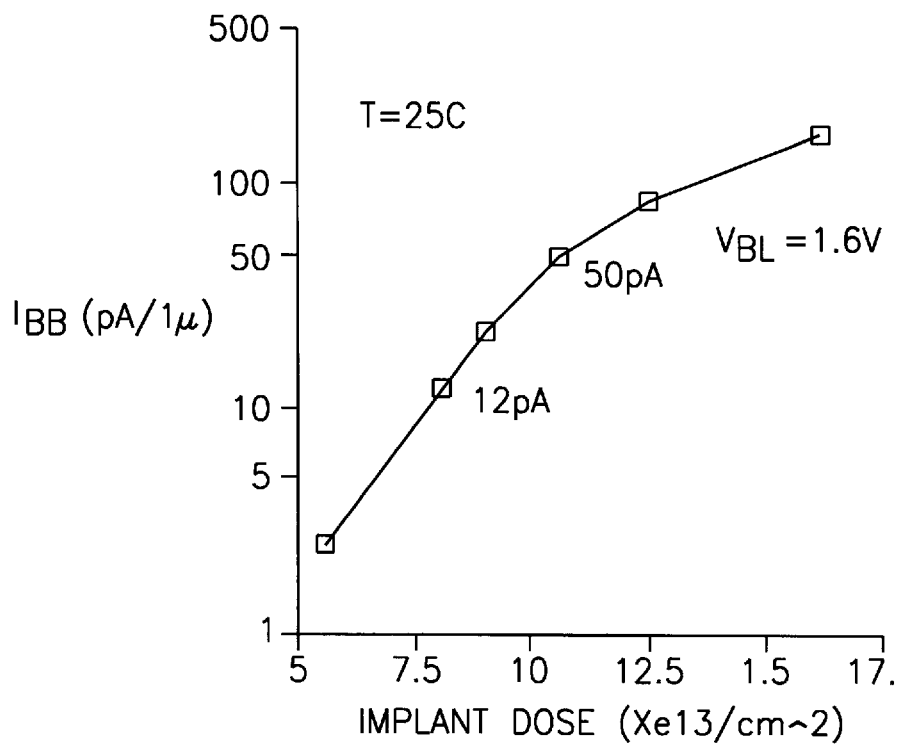
FIGS. 2, 3 and 4 are graphical illustrations of the band-to-band tunneling current versus various parameters.
Figure 3:
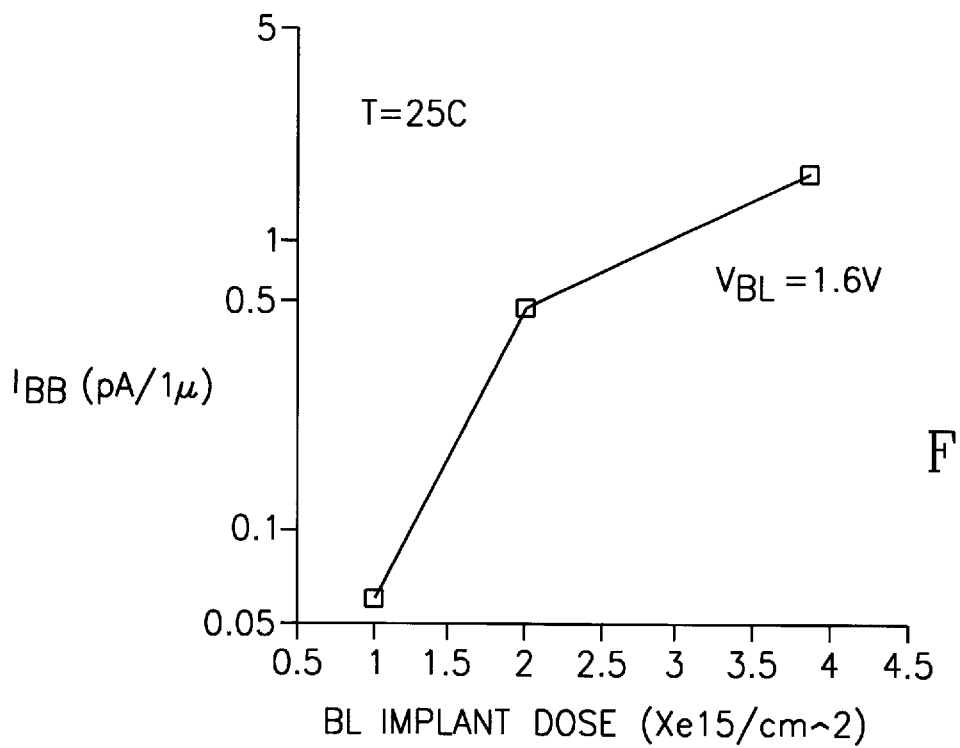
Figure 4:
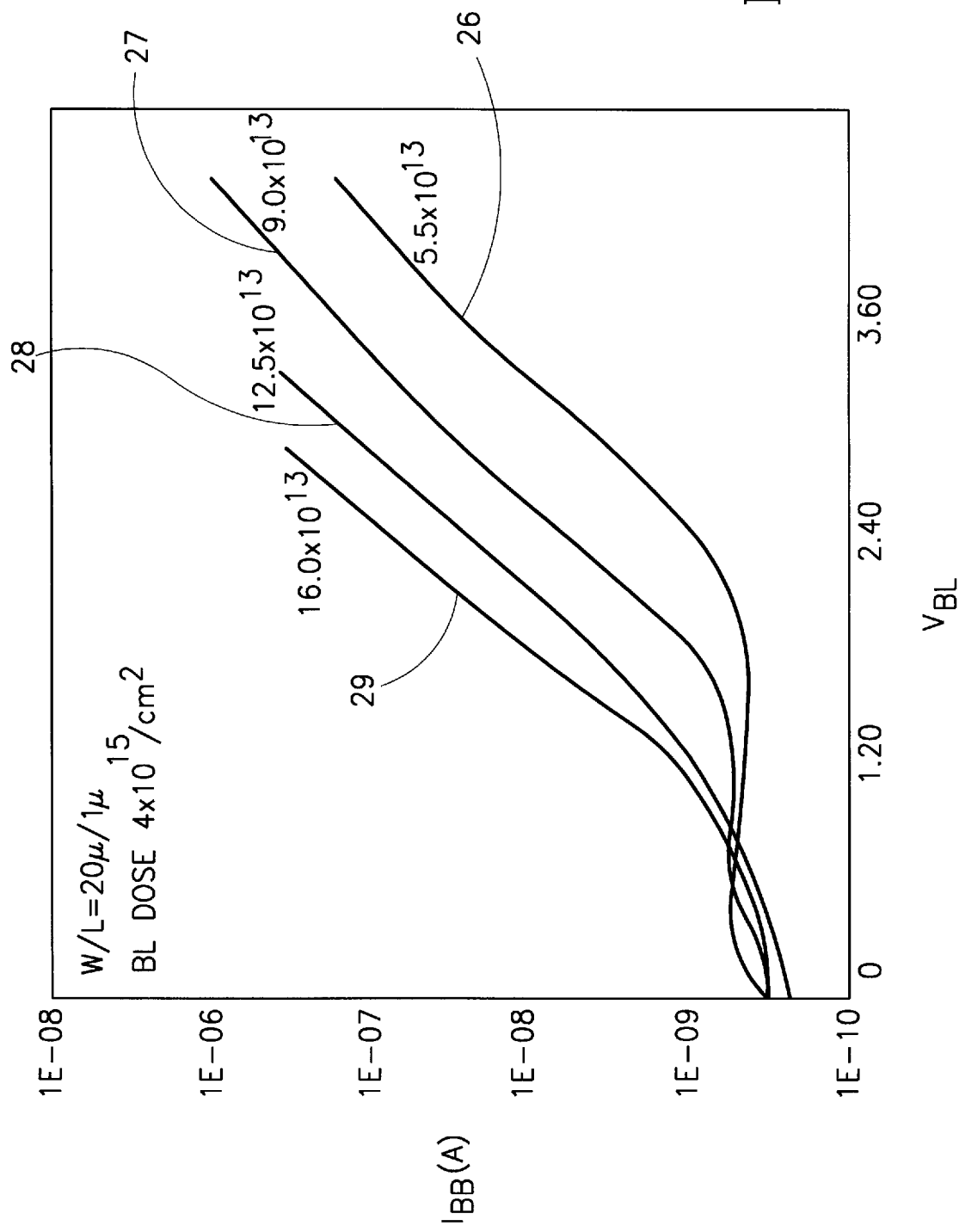
Figure 5:
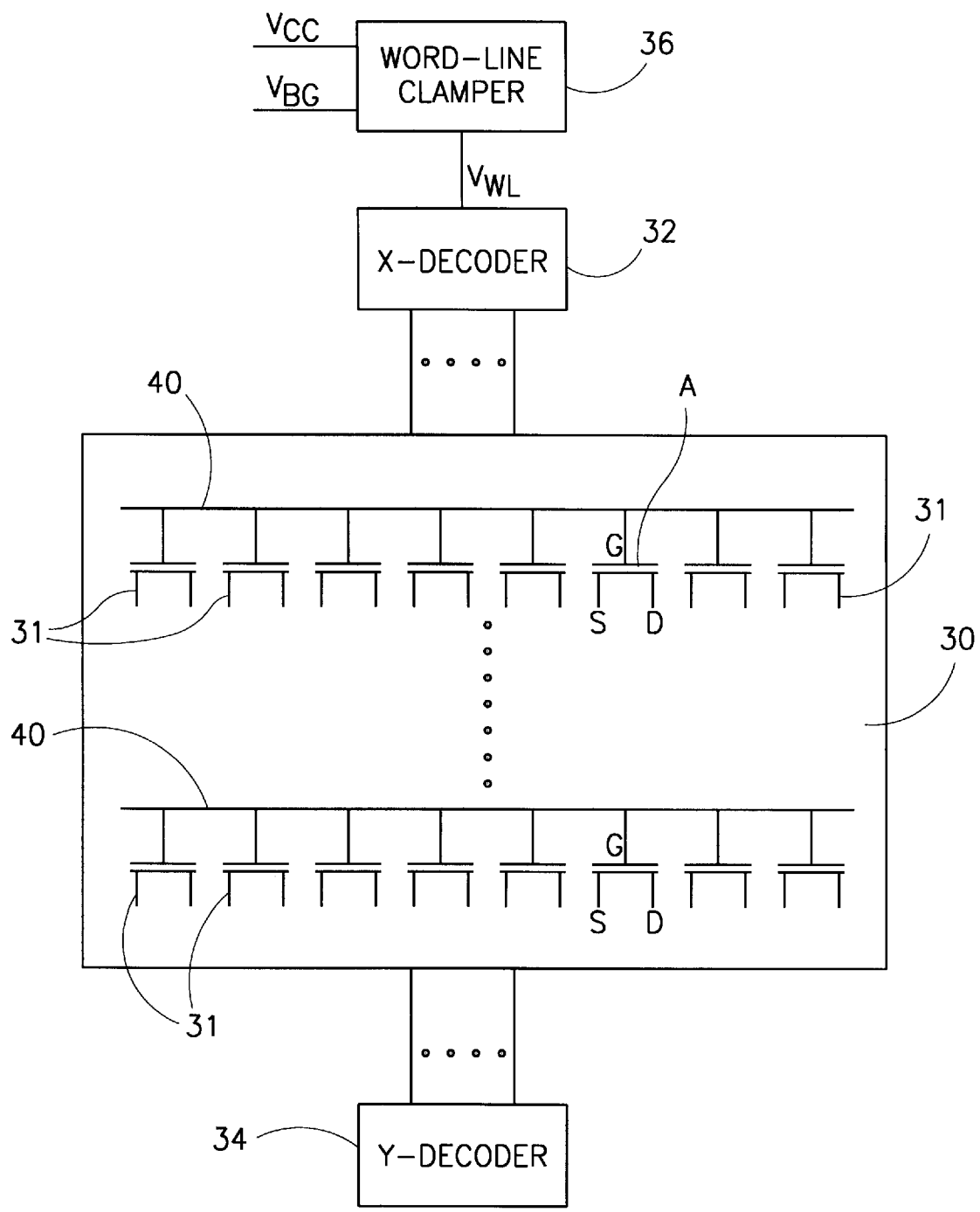
FIG. 5 is a schematic illustration of a ROM array, constructed and operative in accordance with a preferred embodiment of the present invention.
Figure 6:
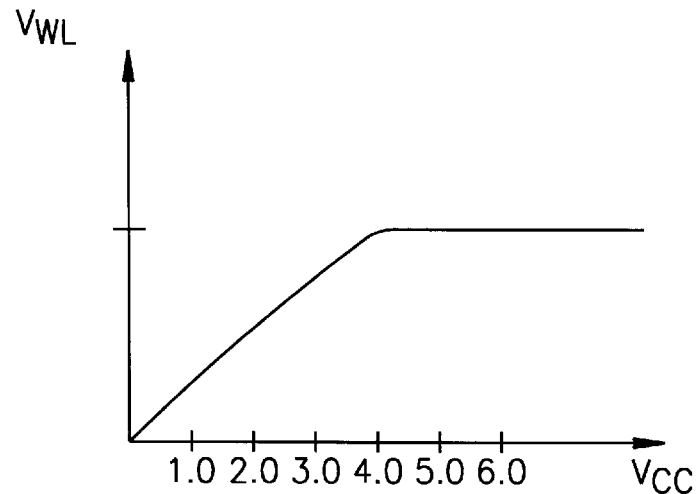
FIG. 6 is a graphical illustration of the voltage on a word-line of FIG. 5.
Figure 7:
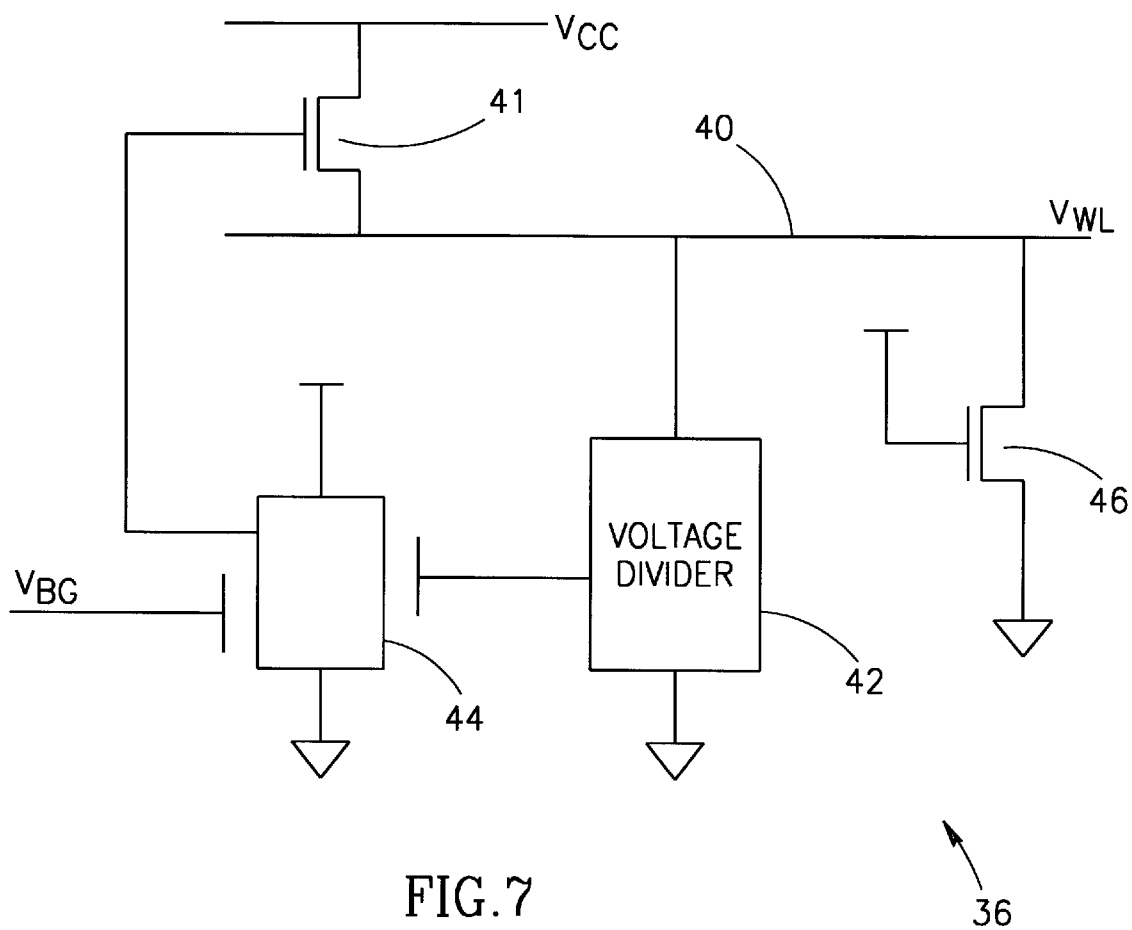
FIG. 7 is a circuit diagram illustration of a word-line clamper useful in the ROM array of FIG. 5.

Reference is now made to FIG. 5 which schematically illustrates a ROM array, constructed and operative in accordance with a preferred embodiment of the present invention, to FIG. 6 which graphically illustrates the voltage level of the word-lines and to FIG. 7 which illustrates a word-line camper of FIG. 5.

As shown in FIG. 5, the ROM array of the present invention comprises a ROM core 30 containing a plurality of ROM transistors 31 storing data to be read, an X-decoder 32 and a Y-decoder 34 for accessing one of the ROM transistors thereby to read the data stored therein and a word-line damper 36.

Each ROM transistor 31, such as the transistor labeled A, has a gate G, a source S and a drain D. The ROM core comprises word lines 40 each connecting the gates of a row of ROM transistors 31 and bit lines (not shown for clarity) each connecting the drains and/or sources of a column of ROM transistors 31. Each ROM transistor typically has two bit lines, one each for the source and drain. In a virtual ground architecture, the bit lines are shared by neighboring transistors, acting as a source or drain depending on the transistor to be accessed.

The X-decoder 32 activates word lines 40 by providing a word-line voltage $V_{WL}$ thereto and the Y-decoder 34 activates bit lines by providing a bit line voltage $V_{BL}$ thereto. A ROM transistor 31 is accessed by receiving voltage on its word-line (from the X-decoder 32) and on its two bit lines (from the Y-decoder 34).

As in prior art ROM arrays, some of the ROM transistors 31 are turned off (logical 0s) with the addition of a ROM implant in the channel. In accordance with a preferred embodiment of the present invention, the ROM implant dosage is defined by the maximal allowed band-to-band tunneling current which, as described in the Background, is a function of the bit line voltage, the bit line implant dosage and the channel implant dosage (which is, itself, a function of the thickness of the gate oxide).

In accordance with a preferred embodiment of the present invention, the bit line implant dosage is determined by the desired resistance and the desired response time (as a fiction of the resistance and capacitance) of the bit lines. The bit line voltage is fixed at the operative voltage of 2 V. The thickness of the gate oxides is defined by the CMOS/PMOS/BICMOS requirements of the periphery of the array (such as the transistors forming part of the X-decoder 32, Y-decoder 34 and word-line clamper 36). With these the values (bit line implant dosage, bit line voltage and gate oxide thickness) being fixed, the band-to-band tunneling current is a function only of the ROM implant dosage.

In accordance with a preferred embodiment of the present invention, the ROM implant dosage is defined as the dosage that produces the maximal allowed band-to-band tunneling current. Thus, in an array in which the bit line voltage is 2 V, the bit line plant dosage is $1\times10^{15}$ atoms/cm$^2$ and the gate oxide thickness is 150 Å (equivalent to that of the periphery), if a maximal tunneling current of 0.2 pA/μm is desired, the maximum ROM implant dosage for the turned off transistors (which store a logical 0) is $4.3\times10^{13}$ atoms/cm$^2$.

Unfortunately, the low ROM implant dosage produces a low threshold voltage level for the turned off translators. In the example provided above, the threshold level is about 4.5 V.

Applicants have realized that, as long as the voltage on the gates of the turned off ROM transistors never exceeds the threshold level of the turned off transistors, the ROM array can be operated and, since the dosage level of the turned off transistors is low enough, the ROM array will have minimal band-to-band tunneling current.

Therefore, in accordance with a preferred embodiment of the present invention, the word-line clamper 36 ensures that the voltage on the word-lines never exceeds the threshold voltage level of the turned off ROM transistors.

FIG. 6 illustrates the word-line voltage $V_{WL}$ produced by the word-line camper 36 as a function of the operative voltage $V_{cc}$. It is noted that, during operation of the ROM array, $V_{cc}$ varies little. However, a startup and other times, $V_{cc}$ can rise from 0 to its maximum value of, typically, 5 V.

As shown in FIG. 6, word-line clamper 36 allows the word-line voltage $V_{WL}$ to follow the value of $V_{cc}$ up to a preset value which, in accordance with a preferred embodiment of the present invention, is set to 0.5 V less than the threshold voltage level of the turned off transistors. Other reference values, such as between 0.2 V and 0.7 V less than the threshold voltage level, can also be chosen.

The word-line clamper 36 is detailed in FIG. 7. It comprises a p-channel transistor 41, an N:1 voltage divider 42, a comparator 44 ant a leaker 46. The p-channel transistor 41 is connected between the operating voltage supply $V_{cc}$ and the word-line 40 and is controlled by the output of the comparator 44. The voltage divider 42 is typically a 3:1 voltage divider, of the resistor, transistor or capacitor divider type, and is connected between the word-line 40 and ground and its output is provided to the comparator 44. The comparator 44 compares the value of the voltage divider output and a bandgap reference signal $V_{BG}$, typically of about 1.2 V. The leaker 46 is connected between the word-line 40 and ground and continually leaks a small amount of current from the word-line 40, in order to stabilize the word-line damper 36 against oscillations. The comparator 44 and p-channel transistor 41 act to maintain the voltage of the word-line 40 at N times the value of the bandgap reference voltage $V_{BG}$.

It will be appreciated that, by choosing the word-line voltage $V_{WL}$, the band-to-band tunneling current $I_{BB}$ can be tailored to meet the specifications of the standby current for any density or future gate oxide thickness.

It will be appreciated by persons skilled in the art that the present invention is not limited to what has been particularly shown and described hereinabove. Rather the scope of the present invention is defined only by the claims which follow:

We claim:

1. A read only memory (ROM) array comprising:

a plurality of complementary metal oxide semiconductor (CMOS) peripheral deviled each having a first gate oxide whose thickness is less than 250 Å;

a voltage supply providing an operating voltage level to said peripheral devices;

a plurality of word-lines;

a multiplicity of ROM transistors, divided into a first group of turned on transistors and a second group of turned off transistors, wherein each ROM transistor has a gate connected to one of said word-lines, wherein each said ROM transistor has a channel and a gate oxide whose thickness is the same as that of said first gate oxide;

wherein said turned off transistors have a ROM implant in their corresponding said channel which generates no more than 0.2 pA/μm of undesired band-to-band tunneling current when said turned off transistors are activated;

wherein said ROM implant and gate oxide thickness define a threshold voltage for said turned off transistors, said threshold voltage being less than said operating voltage level; and a word-line clamper for providing a word-line voltage to each of said word-lines, said word-line voltage being clamped to a voltage level which is not higher than said threshold voltage of said turned off transistor.

2. A ROM array according to claim 1 and wherein said word-line voltage is 0.2–0.7 v less than said threshold voltage.

* * * * *